US012757500B2

(12) United States Patent
Sommer et al.

(10) Patent No.: US 12,757,500 B2
(45) Date of Patent: Oct. 6, 2026

(54) METHOD FOR PRODUCING A VIA IN A III-V MULTIJUNCTION SOLAR CELL

(71) Applicant: AZUR SPACE Solar Power GmbH, Heilbronn (DE)

(72) Inventors: Steffen Sommer, Tamm (DE); Wolfgang Koestler, Heilbronn (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 307 days.

(21) Appl. No.: 18/744,479

(22) Filed: Jun. 14, 2024

(65) Prior Publication Data

US 2024/0421242 A1 Dec. 19, 2024

(30) Foreign Application Priority Data

Jun. 14, 2023 (DE) ..................... 10 2023 002 413.9

(51) Int. Cl.
*H10F 10/142* (2025.01)
*H10F 77/20* (2025.01)

(52) U.S. Cl.
CPC ......... *H10F 10/142* (2025.01); *H10F 77/215* (2025.01); *H10F 77/223* (2025.01)

(58) Field of Classification Search
CPC ................ B23K 26/384; B23K 26/402; B23K 2103/166; H10F 10/142; H10F 77/215; H10F 77/223
See application file for complete search history.

(56) References Cited

U.S. PATENT DOCUMENTS

| | | | |
|---|---|---|---|
| 5,425,816 A | 6/1995 | Cavicchi et al. | |
| 11,063,170 B2 | 7/2021 | Koestler | |
| 11,640,998 B2 | 5/2023 | Koestler | |
| 11,881,532 B2 | 1/2024 | Koestler et al. | |
| 2006/0231130 A1 | 10/2006 | Sharps et al. | |
| 2008/0089637 A1* | 4/2008 | Farah ....................... | G02B 6/30 451/37 |
| 2018/0337299 A1 | 11/2018 | Lee et al. | |

FOREIGN PATENT DOCUMENTS

| | | |
|---|---|---|
| DE | 69216502 T2 | 4/1997 |
| DE | 102019006091 A1 | 3/2021 |
| DE | 102019006094 A1 | 3/2021 |
| DE | 102019008106 A1 | 5/2021 |
| WO | WO2015032241 A1 | 3/2015 |

* cited by examiner

*Primary Examiner* — Daniel P Shook
(74) *Attorney, Agent, or Firm* — Muncy, Geissler, Olds & Lowe, P.C.

(57) ABSTRACT

A method for producing a via in a III-V multijunction solar cell that comprises a substrate arranged on an underside. The substrate has an upper side and an epitaxial layer system with multiple III-V layers on the upper side, and the epitaxial layer system comprises at least one first III-V solar cell. An organic layer is arranged on the upper side of the first III-V solar cell, and an opening having a width X and a base surface formed in the epitaxial layer system is generated in a first method step with a laser. An opening having a width Y and having a base surface is generated in a second method step, width Y being smaller than width X, and an opening having a width Z is generated in a third method step, the opening not having a base surface, and width Z being smaller than width Y.

11 Claims, 2 Drawing Sheets

METHOD FOR PRODUCING A VIA IN A III-V MULTIJUNCTION SOLAR CELL

This nonprovisional application claims priority under 35 U.S.C. § 119 (a) to German Patent Application No. 10 2023 002 413.9, which was filed in Germany on Jun. 14, 2023, and which is herein incorporated by reference.

BACKGROUND OF THE INVENTION

Field of the Invention

The invention relates to a method for producing a via in a III-V multi-junction solar cell.

Description of the Background Art

A laser cutting method is known from DE 692 16 502 T2, which corresponds to U.S. Pat. No. 5,425,816, for producing through-holes for through-contactings in GaAs or Ge solar cells, the disclosed method being aimed at, among other things, avoiding disadvantages of a CVD $SiO_2$ coating in through-holes.

In a first method step, a continuous opening having a large diameter is generated with the aid of laser pulses of a YAG laser. To prepare the very rough surfaces occurring under laser bombardment on the side walls of the through-opening for a later metallization, in a second method step, among other things, a polyimide is cast over the side walls or, in the case of smaller continuous openings, the opening is completely filled with polyimide. In a subsequent method step, the polyimide is heated for curing.

The polyimide is referred to as a dielectric coating. In a fourth method step, a through-hole having a small diameter is generated within the polyimide with the aid of the laser, the polyimide having a smooth surface on the newly created side surfaces after the laser bombardment. The polyimide side surfaces are covered with a metal in a subsequent method step.

By applying polyimide, among other things, the need to smooth the side surfaces by means of an aggressive chemical etching is avoided, and the active region of the solar cell and the GaAs substrate or the Ge substrate are protected against the etching attack. In addition, the polyimide has a good adherence to the substrate as well as with respect to a lead-through metallization to be applied.

SUMMARY OF THE INVENTION

It is therefore an object of the invention is to provide a method which refines the prior art.

The object is achieved by a method for producing a via in a III-V multijunction solar cell according to the present invention.

The exemplary III-V multijunction solar cell has an upper side and an underside, the via being designed to pass through from the upper side to the underside.

The III-V multijunction solar cell comprises a substrate arranged on the underside.

The substrate has an upper side and an epitaxial layer system including multiple III-V layers on the upper side of the substrate.

The epitaxial layer system comprises at least one first III-V solar cell. An organic layer is arranged on the upper side of the first III-V solar cell.

In a first method step, an opening having a width X and having a first base surface formed in the epitaxial layer system is generated with the aid of a laser.

In a second method step, an opening having a width Y and having a second base surface formed in the substrate is generated with the aid of the laser, width Y being smaller than width X.

In a third method step, an opening having a width Z is generated with the aid of the laser for forming the continuous via, the opening not having a base surface, and width Z being smaller than width Y.

The aforementioned method steps can be carried out in the specified sequence or in an arbitrary sequence.

If the aforementioned method steps are carried out in the specified sequence, the second method step is carried out after the first method step, followed by the third method step. It can be understood that, in the second method step, the opening having the second base surface is generated in the first base surface, and in the third method step, the continuous opening referred to as the via is generated in the second base surface.

If the method steps are not carried out in the specified sequence, the third method step is carried out first, and either the second method step or the first method step is then carried out second.

The method step not yet carried out, i.e., the first method step or the second method step, is then carried out. It can be understood that, depending on the sequence, the second base surface is formed after the continuous opening, and the first base surface is formed in the last method step.

The second method step can be carried out first, and the second base surface is formed. Either the first method step is subsequently carried out, forming the first base surface, or the third method step is carried out, forming the continuous opening. The method step not yet carried out, i.e., the third method step or the first method step, is then carried out.

After all three method steps have been performed, regardless of the sequence in which they are carried out, a through-opening having two steps is always formed. In other words, in a cross-sectional view, the through-openings produced in different ways correspond to each other or have exactly the same structure.

It should be noted that the organic layer comprises a lacquer layer and/or a polyimide layer and/or a plastic layer. The layers can be preferably designed to be unstructured to avoid a mask step.

It should furthermore be noted that the via is always an opening formed so that it passes all the way through the entire layers perpendicularly to the front side. Openings of this type may be used for an electrical through-contacting, in that a metal layer is formed in the via.

The substrate can be a semiconductor substrate or a semiconductor wafer having diameter of at least or exactly 100 millimeters or at least or exactly 150 millimeters.

It should also be noted that all method steps can be carried out starting from the upper side, using a laser.

It should be noted that, in the present case, the term dielectric layer can comprise exclusively inorganic layers, in particular oxide and nitride layers.

The III-V layers can be produced exclusively on the substrate by means of an epitaxy process are referred to by the term epitaxial layer system.

It should furthermore be noted that the first base surface formed in the epitaxial layer system or in the substrate can have an opening or a hole, so that the first base surface is designed as a circumferential edge surface starting from the opening or the hole.

The surface formed in the base region, i.e., the first base surface or circumferential edge surface, can be planar or planar in a first approximation, and the surface on the base in the epitaxial layer system is made up exclusively of a III-V material or, in the case of the base surface in the substrate, exclusively of the substrate material.

The side surface resulting in each case during the laser-based method steps can be designed to be exactly perpendicular or nearly perpendicular. The term "nearly perpendicular" can be understood to be a deviation from the perpendicular by less than 5°.

The opening angle can be less than 20° or less than 10°. The opening angle can be understood to be the angle which is inclined against the perpendicular, the inclination taking place to the "outside," so that the total angle is more than 90°. In other words, in a non-perpendicular design, the hole has a larger diameter on the upper side than in the region of the base, the hole being provided with a conical design.

An advantage is that, with the aid of the method, the organic layers, in particular the lacquer layers, may be arranged flexibly in any location on the upper side of the via passing through the III-V multijunction solar cell without further structuring using complex and expensive lithography processes. The upper side, i.e. the front side of the III-V multijunction solar cell, may be electrically contacted from the back with the aid of the via.

A further advantage is that the at least three-step laser method is surprisingly not sensitive to an insignificant change in the layer structure, in particular the thickness and number of III-V layers. The method is also not sensitive to changing the substrate material from Ge to GaAs and vice versa. Insignificant changes are, in particular, a change in the III-V material composition and the stoichiometry and a change in the total layer thickness by less than 20 μm.

Another advantage is that the settings of the laser are easy to change even in the case of a significant change in the substrate thickness. A significant change is, in particular, a change in the thickness of the substrate by at least 50 μm or by at least 100 μm.

Another advantage of laser-based method steps, compared to wet chemical method steps, is that no undercutting takes place. Moreover, wet chemical method steps generally require a structured application of protective lacquers onto the upper surface and/or onto side surfaces of structures to be manufactured, in particular multi-step structures.

By using the laser, the laser method steps can be carried out one after the other without intermediate steps, such as wet etching steps or dry etching steps.

Also, instead of the three consecutive laser method steps, more than three, for example four or five, method steps may be carried out using the laser.

Further method steps can be carried out between or before or after the at least three-step opening method without a laser.

At least one further III-V solar cell can be formed between the substrate and the first III-V solar cell.

The first III-V solar cell, as the topmost III-V solar cell, can have a larger band gap or a band gap of the same size as the underlying III-V solar cells.

To interconnect in series the III-V solar cells arranged in the form of a stack, multiple tunnel diode layers can be arranged between the two III-V solar cells.

The two III-V solar cells can include the same or different materials. The topmost III-V solar cell can comprise an InGaP compound. The further III-V solar cell can be designed as the second III-V solar cell and comprises a GaAs compound or an InGaAs compound.

The substrate can comprise Ge or GaAs or is made up of Ge or GaAs. It can be understood that a multiplicity of III-V layers can be arranged on the substrate. The layers can be epitaxially grown with the aid of a MOVPE system.

A substrate solar cell can be formed in the upper side of the substrate or on the upper side of the substrate. In the case of the GaAs substrate, the substrate solar cell is a III-V solar cell, in the case of Ge, it is a VI solar cell.

It should be noted that, in the example of the substrate as a Ge substrate, the Ge substrate is usually designed as a p-Ge substrate, and in the case of the example of an n-Ge substrate for forming the group VI solar cells on the surface or in the surface of the p-Ge substrate, the n layer can be generated by means of inward diffusion of dopants and not by means of an epitaxy.

The substrate can have a thickness in a range between 80 μm and 850 μm. In another refinement, the thickness of the substrate is in a range between 150 μm and 750 μm.

Further layers can be formed above the first III-V solar cell and below the organic layer.

The width X can be in a range between 5 μm and 5 mm or in a range between 50 μm and 1 mm.

The width Y can be in a range between 5 μm and 5 mm or in a range between 50 μm and 1 mm.

The ratio of width X to width Y can be less than a factor of 10 or less than a factor of 5. In other words, width X is always greater than width Y, but width X is no more than 10 times greater than width Y or no more than 5 times greater than width Y.

The width Z can be in a range from 1 μm to 1 mm, or width Z of the vias is in a range from 20 μm to 0.5 mm.

The organic layer can be designed as a continuous layer covering the entire upper side of the first III-V solar cell, i.e. in an unstructured manner. The organic layer may be applied by spin coating or by another coating method.

At least one III-V layer and/or at least one dielectric layer can be formed between the first III-V solar cell and the organic layer. In another refinement, the dielectric layer comprises or is made up of $SiO_2$.

An anti-reflection layer can be formed between the first III-V solar cell and the organic layer.

A metal layer can be arranged, or precisely no metal layer is formed, on the upper side of the III-V multijunction solar cell in the region of the via between the first III-V solar cell and the organic layer before the first method step. In other words, the method steps may be carried out regardless of whether a metal layer is formed or is not formed at the location of the via to be produced.

The via can have an oval shape. In one refinement, the via has an circular opening.

At least two steps can be formed in the via in a direction from the upper side toward the underside of the III-V multijunction solar cell while the laser process is being carried out.

A wet chemical etching can be performed after the three method steps using the laser are carried out, in particular to clean the upper surfaces and the side surfaces.

Only one of the two steps may be visible after the etching, depending on the etching solution used the duration of its application. The wet chemical etching step is preferably performed immediately after the three laser method steps are carried out.

The removal of the organic layer can be performed only after a wet chemical etching step is carried out. An advantage is that the upper surface is protected by the organic layer against an etching attack.

A constant diameter or a constant diameter in a first approximation can be formed for the via, viewed in a plane formed in parallel to the underside.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

In the cross-sectional views illustrated below, a section of a multijunction solar cell structure MS is shown in each case as part of an entire semiconductor wafer, multijunction solar cell structure MS being also designed, in an example, as a multiplicity of multijunction solar cell structures MS on a semiconductor wafer having a diameter of at least 100 millimeters.

The illustrations below also show exclusively an example, in which the method steps one through three are carried out in the specified sequence, i.e., the first method step is carried out first, the second method step is carried out second, and the third method step is carried out third.

Figure 1:
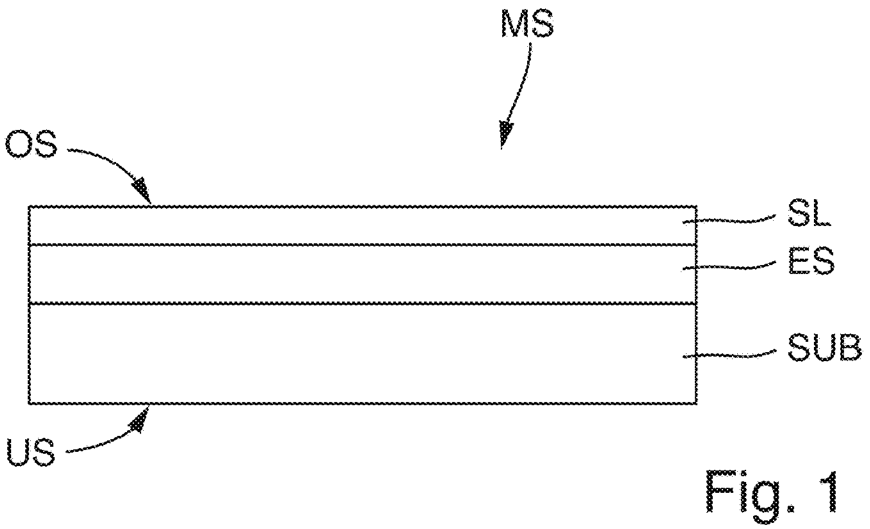
FIG. 1 shows a cross-sectional view of an unprocessed multijunction solar cell structure.

The illustration in FIG. 1 shows a cross-sectional view of the unprocessed multijunction solar cell structure MS, which has an underside US and an upper side OS. A substrate layer SUB made from germanium or GaAS is formed on underside US of multijunction solar cell structure MS.

An epitaxial layer system ES is formed on an upper side of substrate layer SUB. Epitaxial layer system ES is arranged on substrate layer SUB in a materially bonded manner. An organic layer SL designed as a protective lacquer is arranged on epitaxial layer system ES.

In the illustrated example, organic layer SL is connected to the upper side of III-V epitaxial layer system ES in a materially bonded manner.

Further layers, in particular passivation layers, can be formed on epitaxial layer system ES in a materially bonded manner between the epitaxial layer system and organic layer SL.

Further organic and/or inorganic layers can be formed between organic layer SL and epitaxial layer system ES. The further layers preferably comprise or are made up of passivation layers made from, for example, a silicon oxide and/or a silicon nitride.

The aforementioned layers can be arranged in the aforementioned sequence. It should also be noted that all aforementioned layers are each formed over the entire surface area.

In the illustration in FIGS. 2*a* through 2*c*, individual cross-sectional views of an emerging via structure are shown, each individual illustration showing the emerging via structure after carrying out one of the three laser method steps Only the differences from the illustration in FIG. 1 are explained below.

Figure 2A:
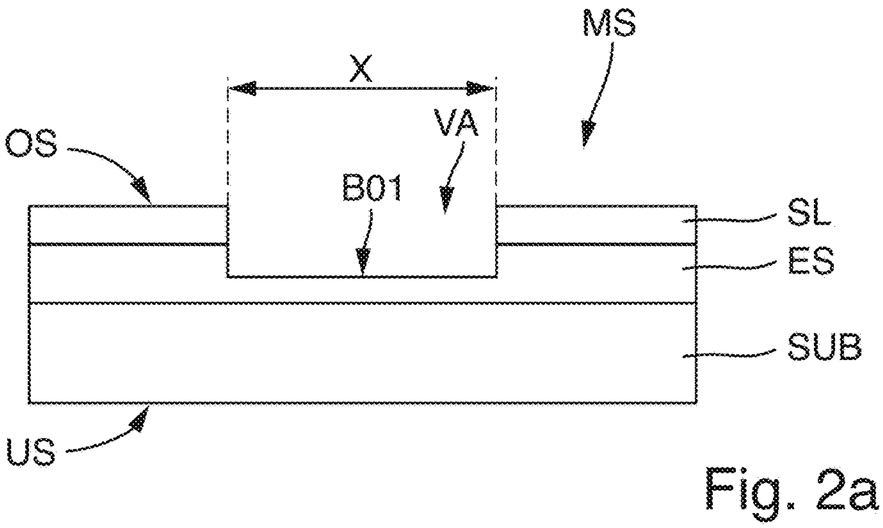
FIGS. 2*a* to 2*c* c show cross-sectional views of an emerging via structure after different laser method steps.
Figure 2B:
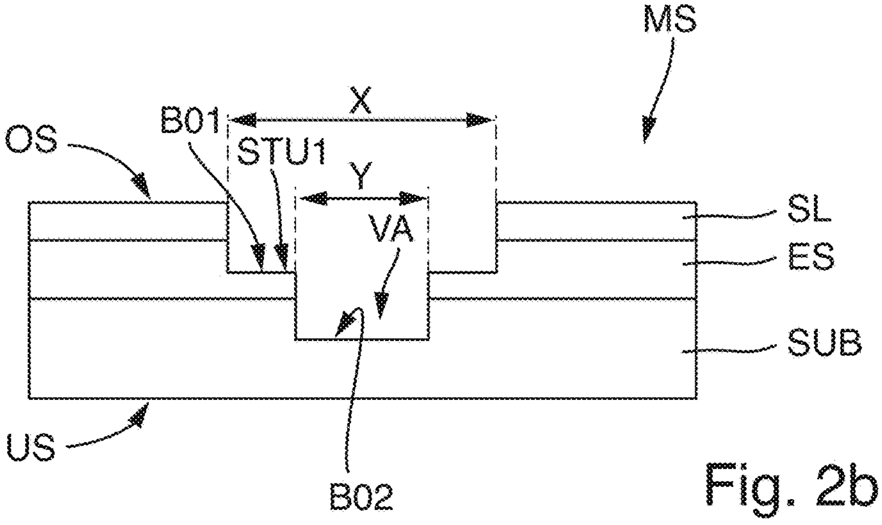

In a first method step, illustrated in FIG. 2*a*, an opening having a width X through organic layer SL and having a first base surface BO1 formed in the epitaxial layer system is generated with the aid of a laser. The resulting side surfaces are designed to be nearly perpendicular.

In a second method step, an opening having a width Y and having a second base surface BO2 formed in the substrate is generated in the base surface with the aid of the laser, width Y being smaller than width X. A first step STU1 results in that a hole is generated only in a portion of first base surface BO1 of the epitaxial layer system. The side surfaces resulting in the second method step are also nearly perpendicular.

In a third method step, an opening having a width Z is generated with the aid of the laser for forming continuous via VA, the opening not having a base surface, and width Z being smaller than width Y. A second step STU2 results in that a hole is created only in a portion of second base surface BO2 of the epitaxial layer system. The side surfaces resulting in the third method step are also nearly perpendicular.

Figure 2C:
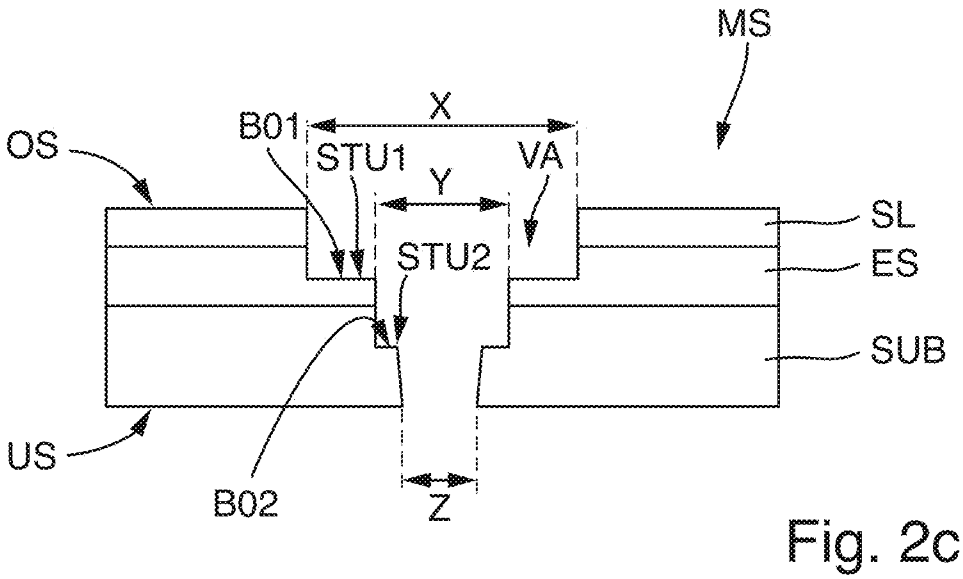
Figure 3:
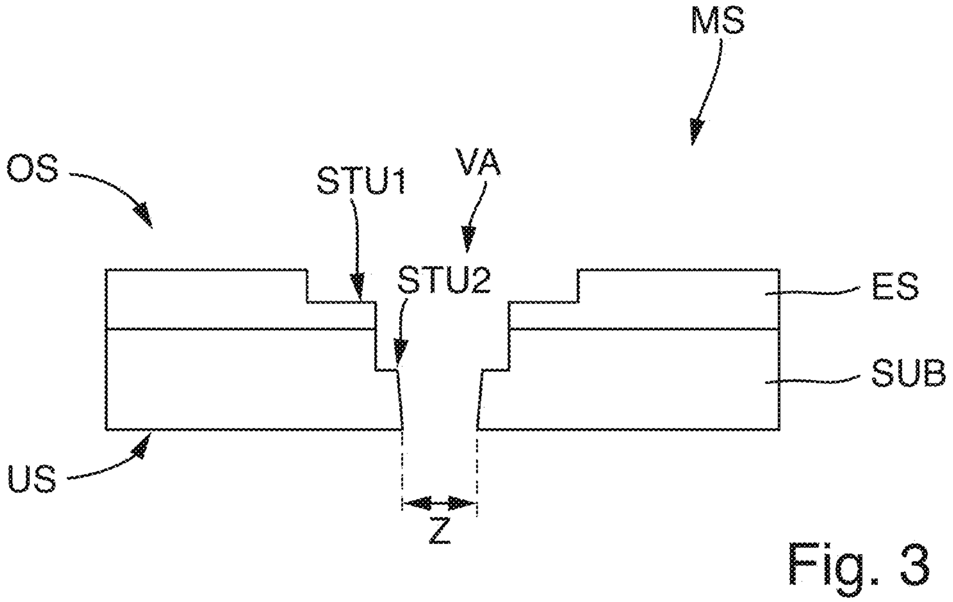
FIG. 3 shows a cross sectional view of a via after a wet etching step.

A cross-sectional view of the via is shown in the illustration in FIG. 3, represented in connection with the illustration in FIG. 2*c*, after a wet etching step. Only the differences from the preceding illustration are explained below.

Organic layer SL is removed from epitaxial layer system ES by means of a lacquer removal process. A wet etching step was preferably carried out prior to removing organic layer SL for the purpose of cleaning contaminants of the three laser method steps from the side surfaces in the via and the further surfaces, in particular the surfaces of the two steps STU1 and STU2, and the side surfaces.

During the wet etching step, first step STU1 is reshaped in such a way that the step surface is moved out of epitaxial layer system ES to the boundary surface of epitaxial layer system ES and the upper side of substrate SUB. The depth of the surface of first step STU1 is also increased. After the etching step has been carried out, the side surfaces within via VA are also nearly perpendicular.

The step surface of the second step is also moved slightly deeper into substrate SUB.

The method steps carried out with the aid of the laser can also be carried out in a different sequence. In particular, the second method step may be carried out before the first method step.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for producing a via in a III-V multijunction solar cell, which has an upper side and an underside, the via being designed to pass through from the upper side to the underside, the III-V multijunction solar cell comprising a substrate arranged on the underside, the substrate having an upper side and an epitaxial layer system with multiple III-V layers formed on the upper side, the epitaxial layer system comprises at least one first III-V solar cell, an organic layer being arranged on the upper side of the first III-V solar cell, the method comprising:

forming an opening having a width X and a having a first base surface in the epitaxial layer system, the opening being formed via a laser;

forming an opening having a width Y and a second base surface in the substrate, the opening being formed via the laser, the width Y being smaller than the width X; and forming an opening having a width Z with the laser to form a continuous via, the opening not having a base surface, and width Z being smaller than width Y.

2. The method for producing a via in a III-V multijunction solar cell according to claim 1, wherein at least one further III-V solar cell is formed between the substrate and the first III-V solar cell, and multiple tunnel diode layers are arranged between the two III-V solar cells, and the two III-V solar cells include the same or different materials.

3. The method for producing a via in a III-V multijunction solar cell according to claim 1, wherein the substrate comprises Ge or GaAs or consists of Ge or GaAs.

4. The method for producing a via in a III-V multijunction solar cell according to claim 1, wherein the substrate has a thickness in a range between 80 μm and 850 μm, or the thickness of the substrate is in a range between 150 μm and 750 μm.

5. The method for producing a via in a III-V multijunction solar cell according to claim 1, wherein further layers are formed above the first III-V solar cell and below the organic layer.

6. The method for producing a via in a III-V multijunction solar cell according to claim 1, wherein the organic layer a continuous layer covering an entire upper side of the first III-V solar cell.

7. The method for producing a via in a III-V multijunction solar cell according to claim 1, wherein at least one III-V layer and/or at least one dielectric layer is formed between the first III-V solar cell and the organic layer.

8. The method for producing a via in a III-V multijunction solar cell according to claim 1, wherein an anti-reflection layer is formed between the first III-V solar cell and the organic layer.

9. The method for producing a via in a III-V multijunction solar cell according to claim 1, wherein a metal layer is arranged or no metal layer is formed on the upper side of the III-V multijunction solar cell in the region of the via between the first III-V solar cell and the organic layer before the step of forming the opening having the width X.

10. The method for producing a via in a III-V multijunction solar cell according to claim 1, wherein the via has an oval shape, and at least one first step or at least two steps or exactly two steps are formed in the via in a direction from the upper side toward the underside of the III-V multijunction solar cell.

11. The method for producing a via in a III-V multijunction solar cell according to claim 1, wherein a constant diameter or a constant diameter in a first approximation is formed for the via, viewed in a plane formed substantially in parallel to the underside.

* * * * *